United States Patent [19]

Hasegawa

[11] Patent Number: 4,639,681

[45] Date of Patent: Jan. 27, 1987

[54] WAVEFORM RESHAPING CIRCUIT

[75] Inventor: Tsunao Hasegawa, Saitama, Japan

[73] Assignee: Pioneer Electronic Corporation, Tokyo, Japan

[21] Appl. No.: 703,966

[22] Filed: Feb. 21, 1985

[30] Foreign Application Priority Data

Feb. 22, 1984 [JP] Japan .................................. 59-32239

[51] Int. Cl.$^4$ ............................................. H03K 5/08
[52] U.S. Cl. .................................... 328/164; 328/117; 307/360; 307/359; 307/480
[58] Field of Search ............... 307/359, 360, 361, 268, 307/480; 328/162, 163, 164

[56] References Cited

U.S. PATENT DOCUMENTS

| 4,425,548 | 1/1984 | Kage | 307/359 |
| 4,449,061 | 5/1984 | Yasuda et al. | 328/164 |
| 4,546,394 | 10/1985 | Yamamoto | 328/164 |
| 4,574,206 | 3/1986 | Todokoro et al. | 307/359 |
| 4,577,155 | 3/1986 | Kobayashi et al. | 328/164 |

Primary Examiner—John S. Heyman
Attorney, Agent, or Firm—Sughrue, Mion, Zinn, Macpeak & Seas

[57] ABSTRACT

In a waveform reshaping circuit for a digital signal which has become distorted, the threshold level is varied according to the codes of bits preceding each bit in a bit string forming data in the digital signal so that, even if coding interference takes place, a reshaped, undistorted digital signal outputted by the circuit is substantially the same in waveform as the original digital signal.

3 Claims, 8 Drawing Figures

FIG. 1
PRIOR ART
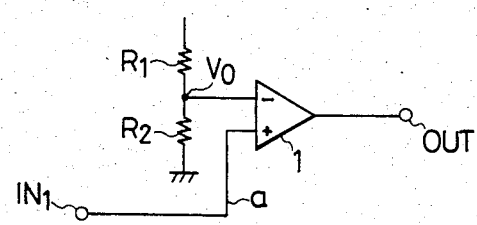
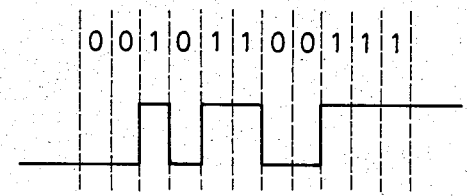
FIG. 2A
FIG. 2B
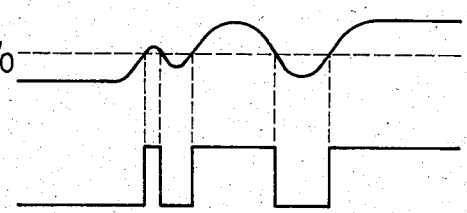
FIG. 2C

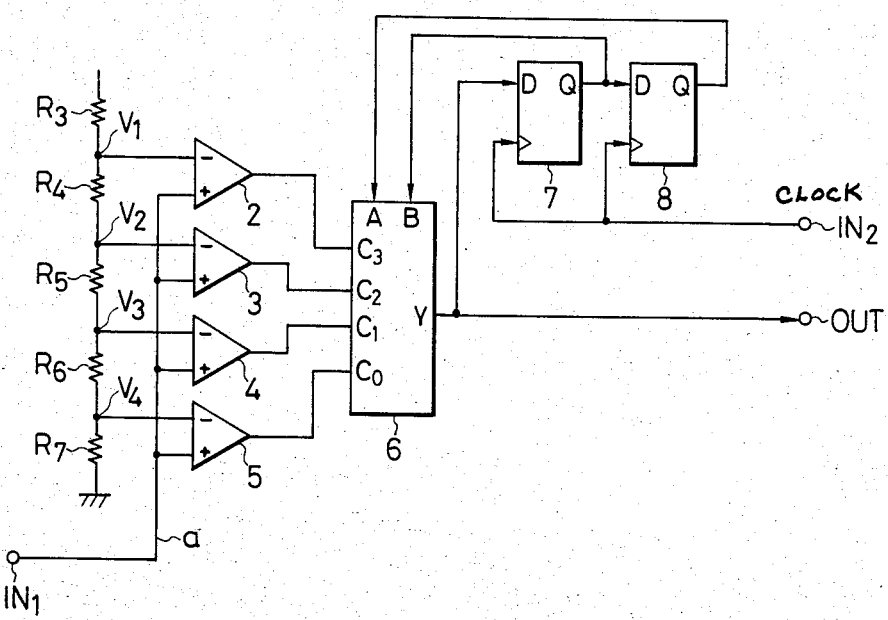
FIG. 3
FIG. 4A
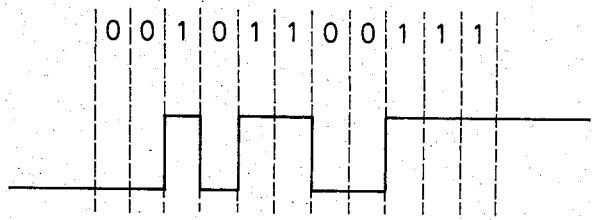
FIG. 4B
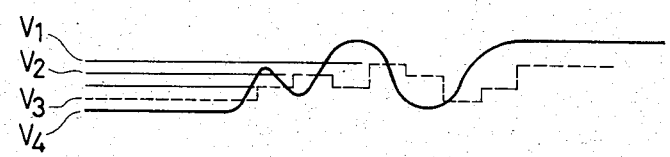
FIG. 4C

WAVEFORM RESHAPING CIRCUIT

BACKGROUND OF THE INVENTION

The present invention relates to waveform shaping circuits, and more particularly to a waveform reshaping circuit for a digital signal which is transmitted (or recorded and reproduced).

For instance, in a digital audio system, a digital signal whose instantaneous level varies with sound data is recorded and reproduced. In the digital audio system, it is difficult to increase the bandwidth of the recording and reproducing system, and therefore the high frequency components of the recorded and reproduced digital signal are attenuated. Accordingly, the waveform of the digital signal is distorted, and its rise and fall times are made longer. Thus, the period of time that the instantaneous level of the recorded and reproduced digital signal is close to the threshold level is increased, increasing the probability of coding errors. Accordingly, it is essential for the digital audio system or the like to have a waveform reshaping circuit for reshaping the waveform of a distorted digital signal in order to correctly extract the data of the digital signal which is recorded and reproduced.

A conventional waveform reshaping circuit of this type is constructed as shown in FIG. 1. In this circuit, a transmitted (or recorded and reproduced) digital signal a is applied through an input terminal $IN_1$ to the positive input terminal of a comparator 1. A voltage $V_0$, which is obtained by dividing a supply voltage with resistors $R_1$ and $R_2$, is applied to the negative input terminal of the comparator 1. The output of the comparator 1 is raised to a high level when the instantaneous level of the digital signal a exceeds the voltage $V_0$, and it is set to a low level when the instantaneous level is equal to or lower than the voltage $V_0$. Thus, the comparator 1 provides a reshaped digital signal at an output terminal OUT in which the rise and fall times are made considerably short by waveform shaping.

On the other hand, if the waveform of a digital signal which corresponds to a bit string as shown in FIG. 2A and which is to be transmitted (or recorded and reproduced) has the actual distorted form shown in FIG. 2B because the bandwidth of the recording and reproducing system is not sufficiently wide, then coding errors occur, and thus the reshaped waveform of the distorted digital signal a supplied to the comparator 1 may be as shown in FIG. 2C. In the digital signal, because the rise and fall times are relatively long, the instantaneous level in the signal is affected by the code of the preceding bit. That is, in the waveform, it is rather difficult to discriminate the bit levels. For instance, when the two preceding bits are both "0", the instantaneous level for "1" becomes extremely low, and when the two preceding bits are both "1", the instantaneous level for "0" becomes extremely high. Accordingly, the comparator 1 outputs a digital signal, as shown in FIG. 2C, in which the duration of an interval corresponding to a bit varies. At a time instant in the duration of the interval, it is necessary to discriminate the code of the bit, thereby to extract the data. If the duration of the interval is made shorter, a jitter margin, i.e., a data extraction margin with respect to a time axis variation, is decreased. Therefore, the conventional waveform shaping circuit suffers from a difficulty that the probability for a coding error to occur is increased when coding interference occurs.

SUMMARY OF THE INVENTION

Accordingly, an object of the invention is to provide a waveform reshaping circuit in which no coding errors occur, even when such interference as described above takes place.

The foregoing object and other objects of the invention have been achieved by the provision of a waveform reshaping circuit for a distorted digital signal whose instantaneous level varies according to binary data, which, according to the invention, comprises: a plurality of comparison means for comparing an instantaneous level of the distorted digital signal with a plurality of reference levels to provide respective outputs, one of the outputs being taken as a digital signal which is waveform shaped selectively according to the binary data in the digital signal which has been outputted.

The nature, principle and utility of the invention will become more apparent from the following detailed description when read in conjunction with the accompanying drawings.

BRIEF DESCRIPTION OF THE DRAWINGS

In the accompanying drawings:

FIG. 1 is a circuit diagram showing a conventional waveform reshaping circuit;

FIGS. 2A-2C are waveform diagrams for a description of the operation of the circuit shown in FIG. 1;

FIG. 3 is a circuit diagram showing an example of a waveform reshaping circuit according to this invention; and FIGS. 4A-4C are waveform diagrams for a description of the operation of the circuit shown in FIG. 3.

DESCRIPTION OF THE PREFERRED EMBODIMENTS

In an example of a waveform reshaping circuit according to the present invention, as shown in FIG. 3, a distorted digital signal a transmitted or recorded and reproduced is applied to the positive input terminals of comparators 2, 3, 4 and 5. A voltage-divider circuit is provided by a series circuit of resistors $R_3$ through $R_7$. Voltages $V_1$, $V_2$, $V_3$ and $V_4$ are provided at the connecting point of the resistors $R_3$ and $R_4$, the connecting point of the resistors $R_4$ and $R_5$, the connecting point of the resistors $R_5$ and $R_6$, and the connecting point of the resistors $R_6$ and $R_7$, respectively. The voltages $V_1$, $V_2$, $V_3$ and $V_4$ thus provided are applied to the negative input terminals of the comparators 2, 3, 4 and 5, respectively. The outputs of the comparators 2 through 5 are employed as input signals $C_0$ through $C_3$ of a signal selecting means, namely, a one-bit, four-channel multiplexer 6.

The output Y of the multiplexer 6 is supplied to the D input terminal of a D flip-flop 7 and to an output terminal OUT. The Q output of the D flip-flop 7 is applied to the D input terminal of a D flip-flop 8 and is applied as a channel selecting control signal B to the multiplexer 6. The Q output of the D flip-flop 8 is applied as a channel selecting control signal A to the multiplexer 6. A data extracting clock pulse which is extracted from a digital signal by a clock pulse extracting circuit (not shown), i.e., a clock pulse generated at the time instant which corresponds to the midpoint of an interval corresponding to a bit of the digital signal, is supplied through an input terminal $IN_2$ to the clock input terminals of the D flip-flops 7 and 8.

In the above-described circuit, the input signals $C_0$ through $C_3$ to the multiplexer 6 are each outputted as the output Y according to the following truth table depending on the control signals A and B:

Truth Table

| A | B | Y |
|---|---|---|
| L | L | $C_0$ |
| L | H | $C_1$ |
| H | L | $C_2$ |
| H | H | $C_3$ |

In the Table, the character L represents a low level and H a high level.

As described above, the clock pulse generated at the time instant which corresponds to the midpoint of an interval corresponding to a bit of the digital signal is applied to the clock input terminals of the D flip-flops 7 and 8. When the clock pulse is generated, the code of the bit which is outputted by the multiplexer 6 and supplied to the D input terminal of the D flip-flop 7 and the code of the preceding bit which has been stored in the D flip-flop 7 are stored in the D flip-flop 7 are stored in the D flip-flops 7 and 8, respectively. Accordingly, in the first half of the interval corresponding to the next bit, the code $X_1$ of the first bit preceding the bit outputted by the multiplexer 6 and the code $X_2$ of the second preceding bit are stored in the D flip-flops 7 and 8, respectively.

The Q outputs of the D flip-flops 7 and 8 are employed as the control inputs B and A, respectively, of the multiplexer 6. Therefore, when the codes $X_1$ and $X_2$ are both in the "0" state, the control signals B and A are both at the low level, and the digital signal waveform shaped with the output of the comparator 5 (or the input signal $C_0$) as the threshold level, i.e., with the lowest $V_4$ of the voltages $V_1$ through $V_4$ as the threshold level, is selectively provided as the output Y.

When the codes $X_1$ and $X_2$ are "0" and "1", respectively, the digital signal waveform shaped with the output of the comparator 4 (which is applied as the input signal $C_1$ to the multiplexer 6) as the threshold level, i.e., with the second lowest voltage $V_3$ as the threshold level, is selectively provided as the output Y.

When the codes $X_1$ and $X_2$ are "1" and "0", respectively, the digital signal waveform shaped with the output of the comparator 3 (which is applied as the input signal $C_2$ to the multiplexer 6) as the threshold level, i.e., with the second highest $V_2$ of the voltages $V_1$ through $V_4$ as the threshold level, is selectively provided as the output Y.

Further, when the codes $X_1$ and $X_2$ are both "1", then the digital signal waveform shaped with the output of the comparator 2 (which is applied as the input signal $C_1$ to the multiplexer 6) i.e., the highest $V_1$ of the voltages $V_1$ through $V_4$ as the threshold level, is selectively provided as the output Y.

If, when a digital signal to be transmitted or recorded and reproduced which corresponds to a bit string as shown in FIG. 4A is as shown in FIG. 4B, coding interference takes place, the instantaneous level at an interval corresponding to a bit of the digital signal a which is inputted through the input terminal $IN_1$ is affected by the codes of the first and second preceding bits. As a result, the waveform of the distorted digital signal a is as shown in FIG. 4C, in which it is rather difficult to discriminate the code of each bit. However, according to the invention, in response to the codes of the first and second bits preceding each bit, the threshold level changes as indicated by the broken line in FIG. 4C, as a result of which the reshaped digital signal is substantially the same in waveform as the original digital signal to be transmitted or recorded and reproduced.

In the above-described waveform reshaping circuit, the threshold level is changed according to the codes of the first and second preceding bits from the bit which is outputted as the output Y. However, the threshold level may be changed according to the code of the first preceding bit only, or more than two codes. That is, what is essential for the circuit is to vary the threshold level according to the codes of the bit or bits preceding the bit which is outputted as the output Y.

The flip-flops 7 and 8 function as a shift register means having a clock input, a data input coupled to an output of the multiplexer, and logic coded clocked outputs coupled to the control inputs of the multiplexer, so that the multiplexer selects an instantaneous reference level from the outputs of the plural comparators according to the binary data in the distorted digital signal, whereby a reshaped undistorted digital output is provided in synchronism with the clock pulses.

As is apparent from the above description, in the waveform reshaping circuit according to the invention, the threshold level is varied according to the codes of bits preceding each bit in a bit string forming data in a digital signal. Therefore, even if coding interference takes place, the reshaped digital signal outputted by the circuit is substantially the same in waveform as the original digital signal to be transmitted or recorded and reproduced. Thus, the circuit of the invention prevents the occurrence of coding errors.

I claim:

1. A waveform reshaping circuit for a distorted digital input signal whose instantaneous level varies according to binary data, comprising:
    a plurality of comparison means for comparing an instantaneous level of said digital signal with a plurality of reference levels to provide outputs, respectively; and
    selecting means for selecting one of said outputs as a digital signal which is waveform shaped selectively according to binary data in said digital signal which has been outputted; and
    wherein said selecting means comprises: a multiplexer having data inputs receiving respective ones of said outputs of said comparison means; and shift register means having a clock input, a data input coupled to an output of said multiplexer, and logic coded clocked outputs coupled to control inputs of said multiplexer, so that said multiplexer selects an instantaneous reference level from said outputs of said plurality of comparison means according to said binary data in said distorted digital input signal, whereby a reshaped undistorted digital output is provided in synchronism with said clock.

2. The waveform reshaping circuit of claim 1, wherein said shift register means comprises a single flip-flop.

3. The waveform reshaping circuit of claim 1, wherein said shift register means comprises two flip-flops.

* * * * *